US006980438B2

(12) United States Patent
Huang et al.

(10) Patent No.: US 6,980,438 B2
(45) Date of Patent: Dec. 27, 2005

(54) SEMICONDUCTOR PACKAGE WITH HEAT DISSIPATING STRUCTURE

(75) Inventors: Chien-Ping Huang, Taichung (TW); Han-Ping Pu, Taichung (TW); Chin-Te Chen, Taichung (TW); Chang-Fu Lin, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 14 days.

(21) Appl. No.: 10/759,863

(22) Filed: Jan. 16, 2004

(65) Prior Publication Data

US 2005/0036291 A1    Feb. 17, 2005

(30) Foreign Application Priority Data

Aug. 12, 2003   (TW) .............................. 92122067 A

(51) Int. Cl.[7] .............................................. H05K 7/20
(52) U.S. Cl. ...................... 361/719; 361/704; 257/706; 257/712; 165/80.3; 165/185
(58) Field of Search ................................ 361/704, 707, 361/709, 716–719; 257/706, 707, 712, 713; 174/52.4, 252; 165/80.3, 185

(56) References Cited

U.S. PATENT DOCUMENTS

| 5,227,663 | A | * | 7/1993 | Patil et al. .................. 257/718 |
| 5,311,402 | A | | 5/1994 | Kobayashi et al. |
| 5,600,541 | A | * | 2/1997 | Bone et al. .................. 361/707 |
| 5,637,920 | A | | 6/1997 | Loo |
| 5,773,886 | A | * | 6/1998 | Rostoker et al. ............ 257/718 |
| 5,909,057 | A | | 6/1999 | McCormick et al. |
| 5,909,474 | A | | 6/1999 | Yoshizawa |
| 5,956,226 | A | * | 9/1999 | Jung et al. .................. 361/514 |
| 6,462,410 | B1 | * | 10/2002 | Novotny et al. ............ 257/707 |
| 6,552,266 | B2 | * | 4/2003 | Carden et al. ............. 174/52.4 |
| 2004/0264136 | A1 | * | 12/2004 | Houle ........................ 361/704 |

* cited by examiner

Primary Examiner—Boris Chervinsky
(74) Attorney, Agent, or Firm—Peter F. Corless; Steven M. Jensen; Edwards Angell Palmer & Dodge LLP

(57) ABSTRACT

A semiconductor package with a heat dissipating structure includes a substrate, a chip and a heat dissipating structure. The chip is mounted on and electrically connected to the substrate. The heat dissipating structure includes a first heat sink having at least one positioning portion, and at least one second heat sink having at least one second positioning portion and at least one hollow portion. The second heat sink is mounted on the substrate, and the first positioning portion of the first heat sink is attached to the second positioning portion of the second heat sink, allowing the chip to be accommodated in a space defined by the first heat sink, the hollow portion of the second heat sink and the substrate. This semiconductor package has good heat dissipating efficiency and is cost-effective to fabricate.

20 Claims, 18 Drawing Sheets

SEMICONDUCTOR PACKAGE WITH HEAT DISSIPATING STRUCTURE

FIELD OF THE INVENTION

The present invention relates to semiconductor packages with heat dissipating structures, and more particularly, to a semiconductor package with a heat dissipating structure achieved with lowered cost and reduced package thickness.

BACKGROUND OF THE INVENTION

A flip-chip ball grid array (FCBGA) semiconductor package incorporates a flip-chip structure and a ball grid array, wherein an active surface of a chip is electrically connected to a first surface of a substrate via a plurality of solder bumps, and a plurality of solder balls are mounted on a second surface of the substrate opposite to the first surface and serve as input/output (I/O) connections. This type of package structure has an advantage of great decrease in size, without using conventional bonding wires. Therefore, impedance or resistance of signal transmission can be reduced while electrical performance would be improved, making the FCBGA package become the mainstream of packaging technology for chips and electronic elements of the next generation.

The FCBGA package is suitably incorporated with multiple chips for high integration and desirable operating performance. Since a multi-chip package generates more heat than a single-chip package, heat dissipation is a crucial factor affecting the performance of the multi-chip package. In a conventional FCBGA package, a heat sink is directly adhered to a non-active surface of a chip mounted in the package to dissipate heat from the chip, rather than dissipating heat via an encapsulating material having poor thermal conductivity, such that the heat dissipating efficiency of this FCBGA package is relatively better than other types of packages.

The above FCBGA package is illustrated in FIG. 17, wherein a supporting part 60b of a heat sink 60 is adhered onto a substrate 62 via an adhesion 61. A flat part 60a of the heat sink 60 is adhered onto a non-active surface 64a of a chip 64 via a thermal paste 63. The heat generated by operation of the chip 64 is dissipated through the exposed flat part 60a of the heat sink 60. U.S. Pat. Nos. 5,311,402, 5,909,474, 5,909,057 and 5,637,920 disclose similar structures to that shown in FIG. 17. However, the heat sink may be fixed in position by different mechanisms; for example, the heat sink can be screwed or fastened by a bolt or other fasteners to the substrate so as to increase bonding between the heat sink and the substrate.

The configuration of the heat sink having the supporting part and the flat part remains substantially unchanged during the evolution and development of the packaging technology. This is because, in the FCBGA package, the heat sink not only defines a space by the flat part and the supporting part in which the chip is received, but also serves a lid to cover the substrate. Therefore, a cross-sectional view of the heat sink appears to be shaped as an upward recess shown in FIG. 17. And the space defined by the heat sink is increased in size according to the number of chips being accommodated therein, making the profile of the package correspondingly increased.

As a result, the configuration of the above upwardly-recessed shaped heat sink sets a limitation in improving the FCBGA package structure and is not desirable for realization of packages with high heat dissipating efficiency, low fabrication cost and small size. Such a conventional heat sink is manufactured by the forging technique to form the flat part and the supporting part. As shown in FIG. 18A and FIG. 18B, a square heat sink 60, for example, is formed by placing a copper or aluminum sheet in a mold at a high temperature and then punching or pressing the sheet at a forging temperature to form a space or recess 65. The chip 64 is accommodated in the space 65 when the heat sink 60 is attached onto the substrate 62. This method is limited by operation of the forging machine and forging hammer and its equipment cost. This is not favorable to the throughput and would cause an increase in the production cost when the size of the heat sink is changed.

Furthermore, the forging method has a problem of limited molding precision. The aspect ratio (t/T) of the heat sink as shown in FIG. 18A and FIG. 18B has a certain upper limit, such that the total thickness T of the heat sink 60 cannot be further close to the height t of the accommodating space 65. Currently, the aspect ratio (t/T) is at most about 0.5. That is, the total thickness T of the heat sink 60 is determined according to the height t of the space 65 to be formed. If the height t of the accommodating space 65 is 1 mm, then the sheet used to form the heat sink 60 needs to be at least 2 mm thick for forging. Therefore, when the thickness of the chip 64 mounted or the number of chips stacked on the substrate 62 is increased, the height t of the space 65 has to be correspondingly increased and the thickness T of the heat sink 60 has to be proportionally increased. As a result, the overall size of the package is difficult to be reduced, which is not favorable to the current trend of size miniaturization. Further, the thickness of the heat sink 60 is increased with the thickness or number of the chip 64, which is detrimental to dissipation of heat from the chip 64.

Referring to FIG. 19 showing a dual-chip package, as compared to the above single-chip package of FIG. 17, the increase in thickness of this dual-chip package includes the thickness of the extra chip 66 and the increase in thickness of the heat sink 60 formed by forging whose total thickness T is raised according to the increased height t of the accommodating space 65 for accommodating the two chips 64, 66. As a result, not only the overall size of the package is increased, but also the fabrication or material cost for the heat sink is increased while the heat efficiency would be reduced in the use of such a thicker heat sink.

The heat sink formed by forging is limited to the type and size of the forging hammer, thereby not allowing desirable flexibility in size and shape of the heat sink for increasing its heat dissipating area. Referring to FIG. 20, additional heat dissipating fins 67 are mounted on the flat part 60a of the heat sink 60 to increase the external contact area. Due to design limitations, the fins 67 are located only right above the flat part 60a, which results in significant increase in the total thickness of the package. Referring to FIG. 21, a passive component 68 is additionally mounted on the substrate 62 to increase the electrical performance of the package, and the accommodating space 65 of the heat sink 60 needs to be enlarged for receiving the passive component 68. However, with the limitation of the size of the forging hammer, the size and shape of the heat sink 60 cannot be flexibly modified according to the layout on the substrate 62, such that fabrication of a batch of new products is required, thereby setting a substantial limitation to wire routing.

In the conventional process, the punching force of the forging hammer at a high temperature forms the accommodating space of the heat sink. When the process is completed, a residual stress is left at a periphery of the accommodating space of the heat sink due to stress concentration, which damages the crystal cells of the copper or aluminum. Therefore, after the package provided with the heat sink has undergone reliability tests or a long-term use, the boundary between the flat part 60*a* and the supporting part 60*b* of the heat ink 60 may suffer a crack 69 due to the residual stress, as shown in FIG. 22. The crack 69 may expand and damage the structure of the heat sink 60.

Furthermore, the conventional heat sink also has the following disadvantages. The flat part and the supporting part of the heat sink are integrally formed. The heat sink is mounted on the substrate by attaching the supporting part to the substrate, and the flat part of the heat sink is in contact with the chip. There is a great difference between the respective coefficients of thermal expansion (CTE) of the heat sink and the chip. When the package is subjected to high temperature processing, the flat part of the heat sink is deformed more seriously than the chip. Since the periphery of the flat part is sustained by the supporting part, the thermal strain is difficult to release, and the deformation of the heat sink as shown in FIG. 23 is generated. As a result, delamination 70 is generated between the flat part 60*a* and the chip 64 or between the flat part 60*a* and the thermal paste 63, thereby reducing the heat dissipating efficiency of the package. When the package with the deformed heat sink 60 is subject to an external shock, the supporting part 60*b* of the heat sink 60 may be delaminated from the substrate 62, thereby making the heat sink 60 uncoupled from the substrate 62.

The heat sink is used for heat dissipation of the FCBGA package. However, as the electronic device has been developed with increasingly high integration and heat dissipation and decreasingly low cost and small size, the limitations of size and production process of the heat sink are to be overcome for the next generation of packages. Slight modification to the structure of the heat sink formed by the current forging process cannot overcome all the problems in the art.

Therefore, there is a need of a semiconductor package having a heat dissipating structure formed without the limitation of the aspect ratio, such that the heat dissipating performance can be increased, and the beat sink can be flexibly sized, so as to solve the foregoing prior-art problems.

SUMMARY OF THE INVENTION

An object of the present invention is to provide a semiconductor package having a heat dissipating structure, which is formed with low cost without the need of forging.

Another object of the invention is to provide a semiconductor package having a heat dissipating structure, which has reduced package height.

Still another object of the invention is to provide a semiconductor package having a heat dissipating structure, which is formed without an aspect ratio limitation.

A further object of the invention is to provide a semiconductor package having a heat dissipating structure that can increase the heat dissipating area.

A further object of the invention is to provide a semiconductor package with a heat dissipating structure that can prevent stress concentration on the heat sink.

A further object of the invention is to provide a semiconductor package with a heat dissipating structure in which deformation or delamination does not occur.

A further object of the invention is to provide a semiconductor package with a heat dissipating structure in which an adhesion of the heat sink within the package is increased.

A further object of the invention is to provide a semiconductor package with a heat dissipating structure in which the size and shape of the heat sink is variable.

In order to achieve the above and other objectives, the present invention proposes a semiconductor package including a substrate, a chip, a heat dissipating structure and a plurality of solder balls. The substrate has a first surface and a second surface opposite to the first surface. The chip is mounted on the first surface and electrically connected to the substrate. The heat dissipating structure includes a first heat sink and at least one second heat sink. The first heat sink has at least one first positioning portion. The second heat sink has at least one second positioning portion and at least one hollow portion. The second heat sink is mounted on the first surface of the substrate. The first positioning portion of the first heat sink is attached on the second positioning portion of the second heat sink. The chip is accommodated in a space defined by the hollow portions of the first heat sink and the second heat sink and the substrate. The solder balls are mounted on the second surface of the substrate.

The first heat sink and the second heat sink are in the shape of plate. The first heat sink is referred to as a top heat sink. The second heat sink includes a bottom heat sink and at least one interlayer heat sink that are stacked one another in a manner to substantially align the respective hollow portions with one another. The heat sinks with the positioning portions are formed by low-cost stamping. The positioning portions are respectively located at the peripheral regions of the heat sinks. The first positioning portion and the second portion respectively are a flange and a recess that fit each other.

Furthermore, the heat dissipating structure is varied according to the demand of the package. For example, the inner edges or the outer edges of the first heat sink and the second heat sink are aligned with each other in the stack of the heat sinks. When the second heat sink has a plurality of interlayer heat sinks, the inner edges or the outer edges of the interlayer heat sinks are either aligned with one another or in a stagger arrangement.

Furthermore, the area of the first heat sink is optionally enlarged to increase the heat dissipating performance of the package. A fan may be further added on the first heat sink. Alternatively, at least one additional heat sink with a hollow portion is stacked on the first heat sink in a manner to align the hollow portion with the chip for further heat dissipation.

A plurality of slots are formed on the side of the substrate contacting with the second heat sink by punching for filling of an adhesive, so that the adhesion of the second heat sink is increased. The slot may have a stepped or tilted inner surface to increase the adhering area between the adhesive and the slot, so that the heat sink is prevented from being separated due to external shock.

The heat dissipating structure according to the invention formed without a forging process completely overcomes the limitation of the prior art in respect of the arrangement of the heat sinks, and achieves high integration and good heat dissipation with a lower production cost and a smaller size.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1:
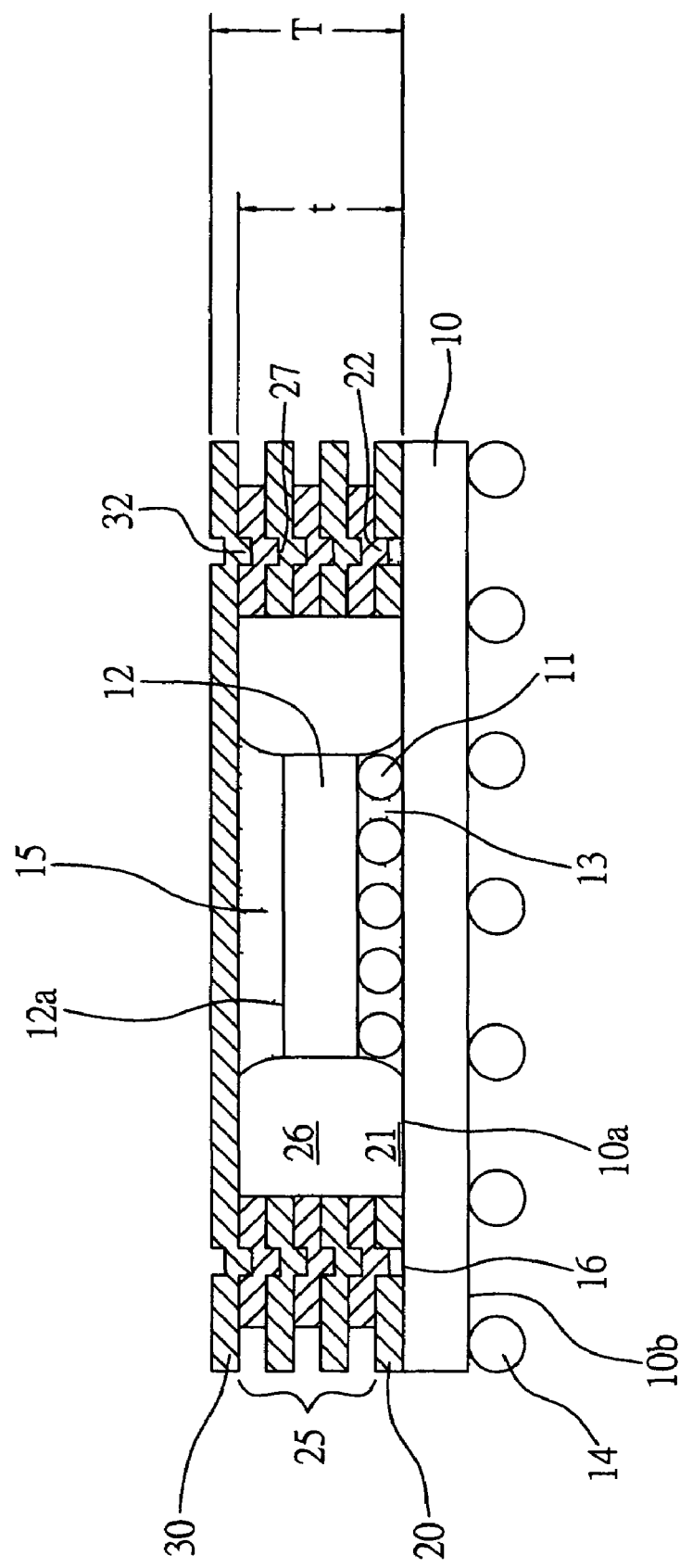
FIG. 1 is a cross-sectional view of a semiconductor package with a heat dissipating structure according to a first preferred embodiment of the invention.

FIG. 1 is a cross-sectional view of a semiconductor package having a heat dissipating structure according to a first embodiment of the invention. The semiconductor package is a flip-chip ball grid array (FCBGA) and includes a substrate 10 as a chip carrier. A chip 12 is mounted on and electrically connected to a first surface 10a of the substrate 10 via bumps 11. An insulation material 13 fills gaps between the bumps 11 to form an underfill. A bottom heat sink 20 is mounted on the first surface 10a of the substrate 10. Interlayer heat sinks 25 are stacked on the bottom heat sink 20. A top heat sink 30 is stacked on the top of the interlayer heat sinks 25. Solder balls 14 are attached on a second surface 10b of the substrate 10 and electrically connected to the bumps 11. An adhesive 16 is applied over the first surface 10a of the substrate 10 for attaching the bottom heat sink 20 on the substrate 10. The top heat sink 30 is attached on a non-active surface of the chip 12 via a thermal paste which promotes heat dissipation from the chip 12. Furthermore, the interlayer heat sinks 25 and the bottom heat sink 20 respectively have a first hollow portion 26 and a second hollow portion 21 defining a space after stacking on the substrate 10, as shown in FIG. 1. The chip 12 is accommodated inside the space defined by the top heat sink 30, the first hollow portion 26, the second hollow portion 21 and the substrate 10.

Figure 2A:
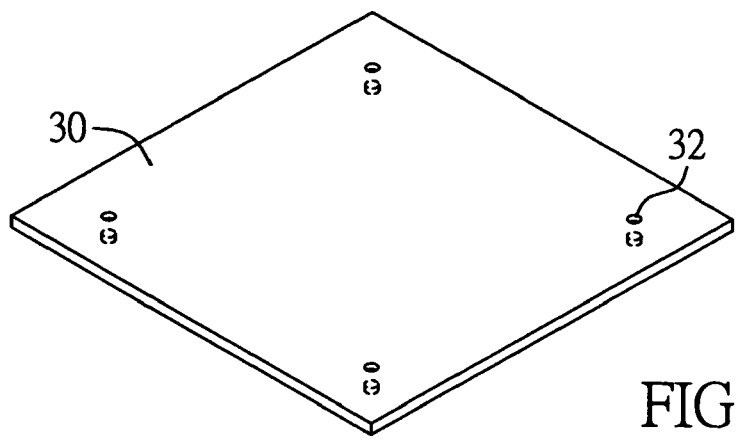
FIG. 2A to FIG. 2C are schematic views showing a top heat sink, interlayer heat sinks and a bottom heat sink according to the preferred embodiment of the invention.
Figure 2B:
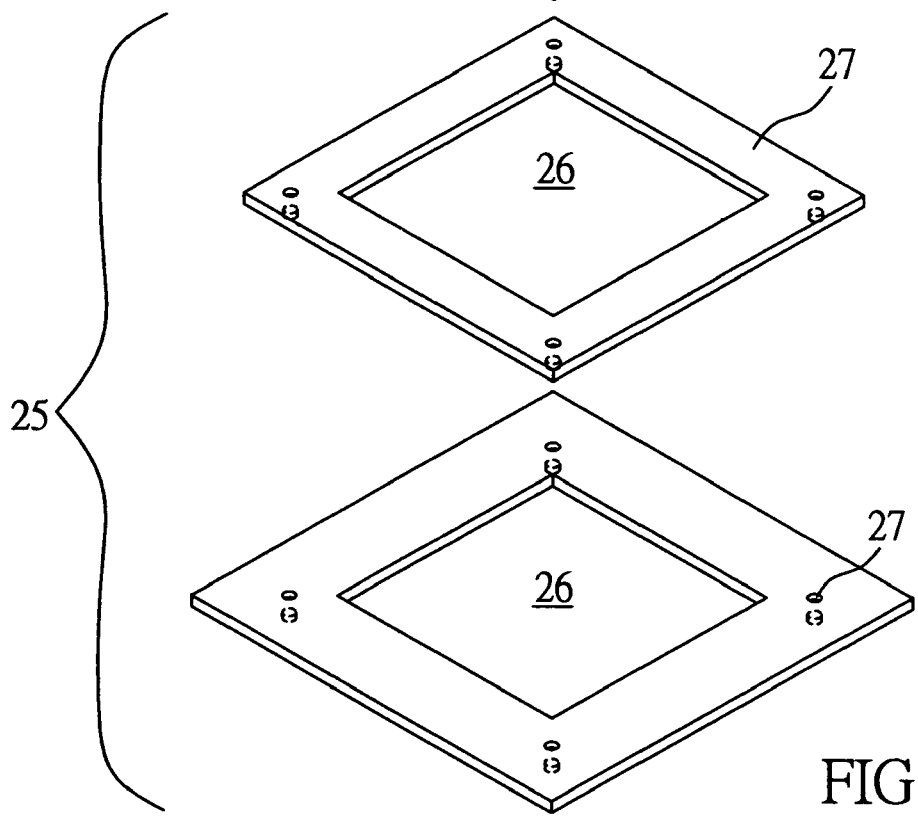
Figure 2C:
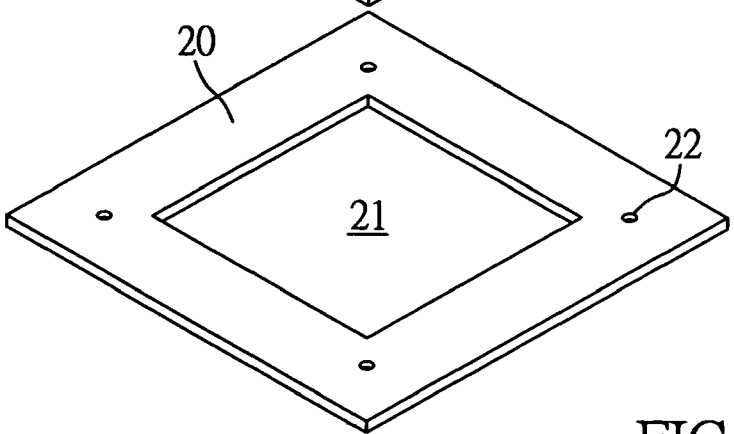

As respectively shown in FIG. 2A, FIG. 2B and FIG. 2C, the top heat sink 30, the interlayer heat sinks 25 and the bottom heat sink 20 are plate type heat sinks. The material for the heat sinks has good thermal conductivity, such as copper or aluminum coated with nickel thereon. Furthermore, the material for the heat sinks also has a coefficient of thermal expansion substantially equal to that of the material of the substrate, which can be, for example, epoxy resin, polyimide, BT resin or FR4. Therefore, warping or delaminating between the bottom heat sink 20 and the substrate 10 does not occur when the processing temperature varies. Each heat sink has a thickness of less than 10 mils to allow high freedom of design with a small package thickness. The number of interlayer heat sinks 25 is determined based on the thickness of the chip 12 or the configuration of the whole package, provided that the top heat sink 30 is flatly attached on the non-active surface 12a of the chip 12.

In FIG. 2B and FIG. 2C, the first hollow portions 26 and the second hollow portion 21 are respectively formed at their central portions. The shapes of the first and second hollow portions 26, 21 are square. After the interlayer heat sinks 25 and the bottom heat sink 20, peripheries of the hollow portions 26, 21 are aligned with one another to define a square space above the substrate 10. The chip 12 is accommodated inside the space. In FIG. 2B, the interlayer heat sinks 25 are made with two sizes and are alternately stacked with the outer edges of the adjacent interlayer heat sinks not being aligned with each other to increase heat dissipation areas.

Furthermore, each of the top heat sink 30, the interlayer heat sinks 25 and the bottom heat sink 20 has a first positioning portion 32, a second positioning portion 27 and a third positioning portion 22 respectively at four corners. The first positioning portion 32 is a flange. The second positioning portion 27 includes a flange and a corresponding recess. The third positioning portion 22 is a hole. The flanges, the recesses and the holes of the positioning portions 32, 27, 22 correspond to one another for attaching the heat sinks. As shown in FIG. 1, the second positioning portion 27 of the lowest interlayer heat sink 25 fits in the third positioning portion 22 of the bottom heat sink 20. The second positioning portion 27 of one interlayer heat sink 25 fits in the third positioning portion 22 of its neighboring heat sink 25. Finally, the flange of the first positioning portion 32 of the top heat sink 30 fits in the recess of a second positioning portion 27. Thereby, stacking of the heat sinks is accomplished.

Figure 3A:
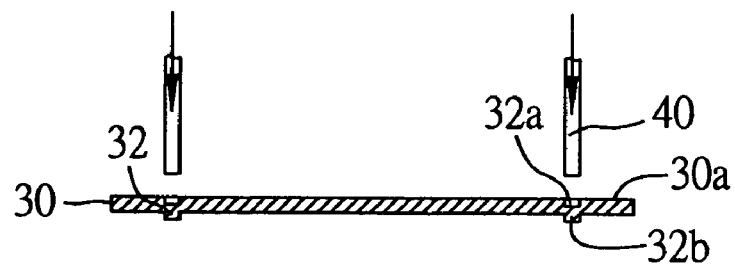
FIG. 3A to FIG. 3C are schematic views showing formation of a first positioning portion, a second positioning portion and a third positioning portion respectively on heat sinks according to the first preferred embodiment of the invention.
Figure 3B:
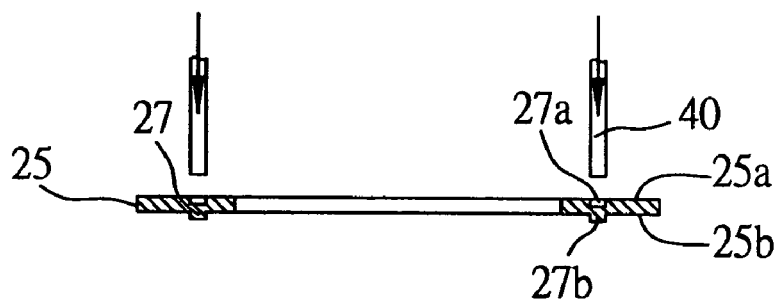
Figure 3C:
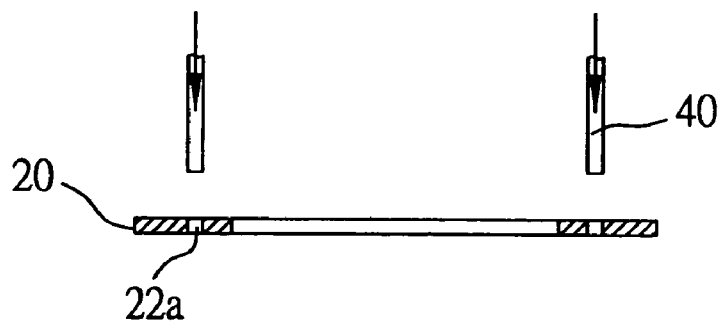

FIG. 3A, FIG. 3B and FIG. 3C respectively illustrate the formation of the first positioning portion 32, the second positioning portion 27 and the third positioning portion 22. A stamping process using a punch of a predetermined size is performed to form a desired shape of the positioning portion. As shown in FIG. 3C, a flat punch 40 punches through the flat bottom heat sink 20 to from a hole 22a. The size of the hole 22a is determined based on the size of the punch 40. The hole 22a of the heat sink 20 allows the passage of an adhesive 16 under pressure between the bottom heat sink 20 and the substrate 10, thereby increasing the adhesion of the interlayer heat sink 25 to the bottom heat sink 20. In FIG. 3B, the flat punch 40 punches an upper surface 25a of each interlayer heat sink 25 to form a recess 27a that does not go through the heat sink 25. Meanwhile, a flange 27b is formed on a lower surface 25b of each interlayer heat sink 25 to correspond to the recess 27a. The size of the flange 27b fits the hole 22a of the bottom heat sink 20. In FIG. 3B, the flat punch 40 punches an upper surface 30a of the top heat sink 30 to form a recess 32a on the upper surface 30a and a flange 32b on a lower surface 30b. The flange 32b of the top heat sink 30 fits the recess 27a of the uppermost interlayer heat sink 25. It is noted that the bottom heat sink 20, the interlayer heat sinks 25 and the top heat sink 30 are sequentially stacked on the substrate 10. The formation of the first positioning portion 32, the second positioning portion 27 and the third positioning portion 22 requires high precision so as to stack the heat sinks by fitting the recesses with the flanges. The first hollow portions 26 of the heat sinks 25 are aligned with the second hollow portions 21 of the bottom heat sink 20 to accommodate the chip 12 therein Therefore, with the design of the heat sinks described above, the heat sinks are stacked to define a chip accommodating space which is different from the integrally-formed prior art. No forging process therefore is needed. The heat sinks are obtained by low-cost stamping process with high design freedom. Furthermore, the heat sinks 20, 25, 30 are thin so that the number of heat sinks may be changed as desired by, for example, varying the number of interlayer heat sinks. The stack of the heat sinks has no limit regarding to the aspect ratio. As shown in FIG. 1, the height T of the stack of the heat sinks is just higher than the height t of the chip accommodating space by about the thickness of the top heat sink 30. The stack of the heat sinks greatly reduces the height of the conventional package and satisfies the demand of new-generation package structures. Furthermore, the size or area of the heat sink may be changed according to the layout of the chip on the substrate 10 for high freedom of design or for increasing the thermal efficiency of the package. The heat sinks stacked on the substrate are respectively in the shape of a plate without further processing. Therefore, there is no residual stress inside the stack, while the chip accommodating space allows the semiconductor package to pass subsequent high temperature processes and various reliability tests without occurrence of deformation or delamination of the stack of heat sinks due to temperature change. Thereby, the invention significantly overcomes the disadvantages in the art.

Second Preferred Embodiment

Figure 4:
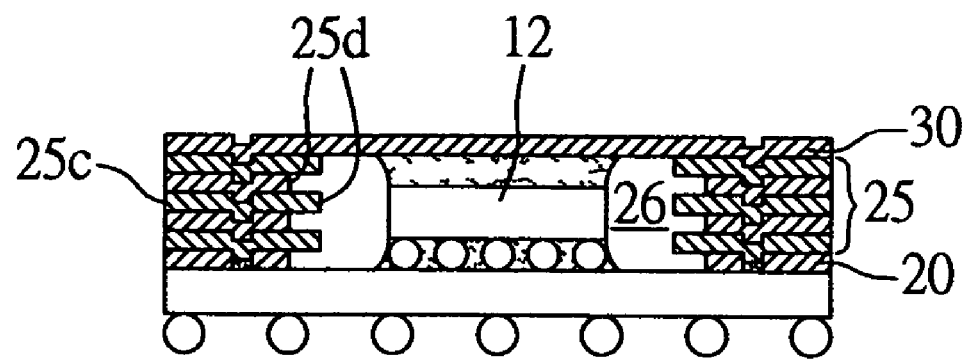
FIG. 4 is a cross-sectional view of the semiconductor package according to a second preferred embodiment of the invention.

Although the invention is illustrated with the description of the above embodiment, equivalents thereof may be also envisaged. FIG. 4 is a cross-sectional view of a stack of heat sinks according to a second embodiment of the invention. The stack of heat sinks of this second embodiment has the same elements as those of the first embodiment, except that the heat sinks are arranged differently from the first embodiment. In the first embodiment, the edge of the hollow portion 26 of each heat sink 25 is aligned with one another while the outer edges of the heat sinks 25 are arranged in a stagger manner to increase the heat dissipation area of the heat sinks 25. In this second embodiment, an outer edge 25c of each interlayer heat sink 25 is aligned with one another. The inner edges 25d of the interlayer heat sinks 25 (i.e. periphery of the first hollow portion 26) are arranged in a stagger manner so that the chip accommodating space defined by the inner edges of the beat sinks 25 is sufficient to accommodate the chip without the inner edges 25d contacting the chip 12.

Third Preferred Embodiment

Figure 5:
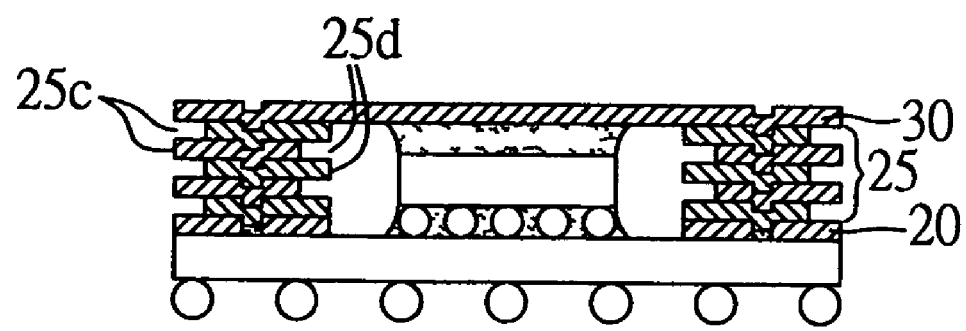
FIG. 5 is a cross-sectional view of the semiconductor package according to a third preferred embodiment of the invention.

This third embodiment combines the first and second embodiments, as shown in FIG. 5. Both inner and outer edges of each heat sink are not aligned with one another. Thereby, the heat dissipation area is further increased to provide higher heat dissipation performance.

Fourth Preferred Embodiment

Figure 6:
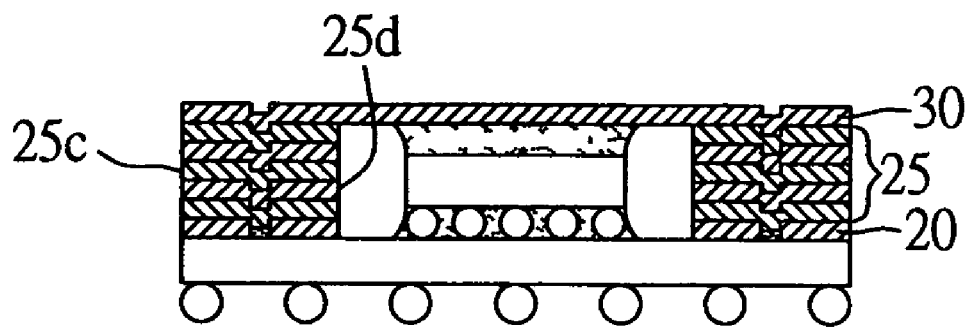
FIG. 6 is a cross-sectional view of the semiconductor package according to a fourth preferred embodiment of the invention.

The arrangement of the heat sinks is not limited to the above manners. FIG. 6 illustrates another arrangement of the heat sinks. The top heat sink 30, the interlayer heat sinks 25 and the bottom heat sink 20 have the same size and are stacked in a manner that the inner and outer edges 25d, 25c of the heat sinks are all aligned with one another after having been stacked to form a package having smooth side surfaces.

Fifth Preferred Embodiment

Figure 7:
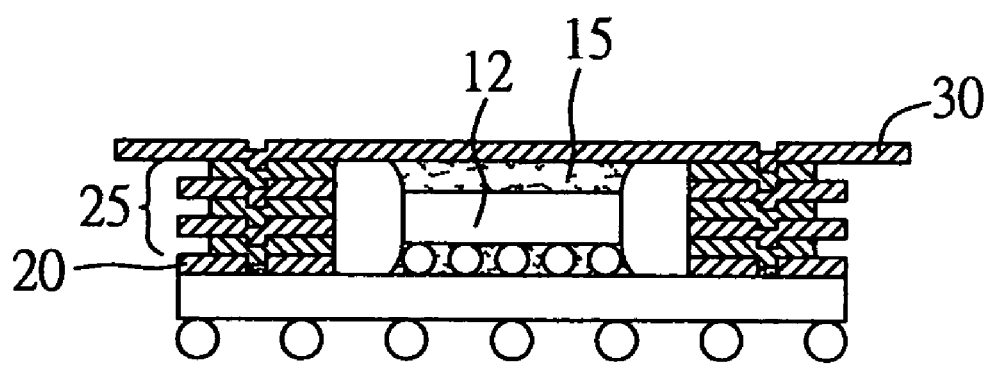
FIG. 7 is a cross-sectional view of the semiconductor package according to a fifth preferred embodiment of the invention.

FIG. 7 is a cross-sectional view of a heat dissipating structure according to a fifth embodiment of the invention. The top heat sink 30 is enlarged so that the area of the top heat sink 30 is much larger than those of the interlayer heat sinks 25 and the bottom heat sink 20 to increase the heat dissipating area. Furthermore, heat may be dissipated via the top heat sink 30. The size or shape of the top heat sink 30 is not particularly limited, as long as it promotes heat dissipation. This is in contrast to the prior art which heat dissipating area cannot be changed due to the limitation of the manufacturing process. Furthermore, heat dissipating fins are not required in this embodiment.

Sixth Preferred Embodiment

Figure 8A:
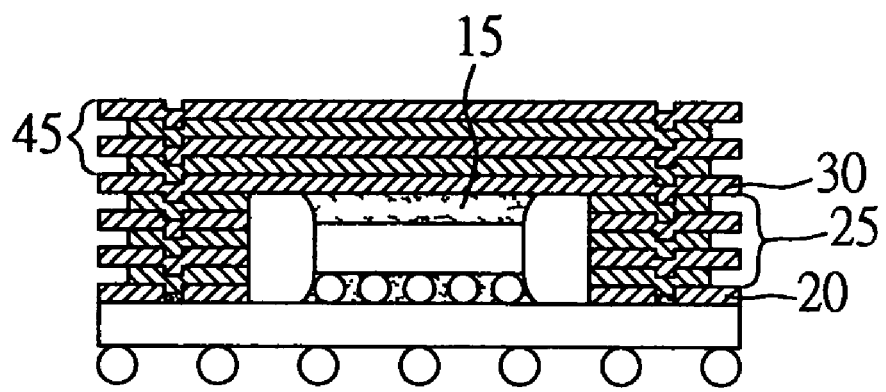
FIG. 8A and FIG. 8B are cross-sectional views of the semiconductor package according to a sixth preferred embodiment of the invention.
Figure 8B:
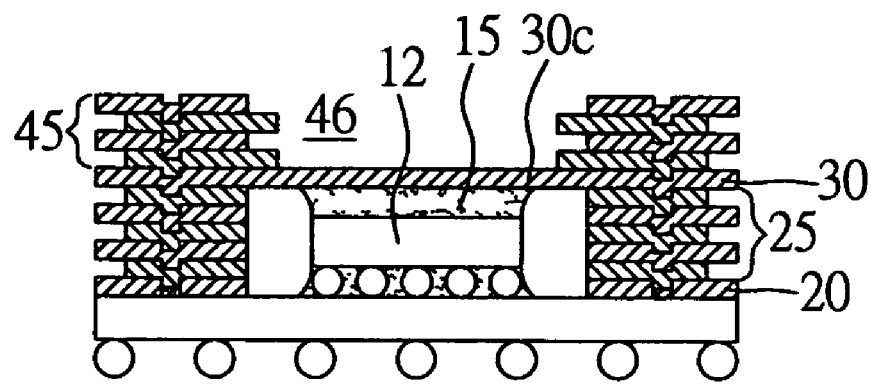

In addition to the bottom heat sink 20, the interlayer heat sinks 25 and the top heat sink 30, additional heat sinks 45 may be further stacked on the top heat sink 30. The additional heat sinks 45 are plate-shaped heat sink having no hollow portion, as shown in FIG. 8A. The additional heat sinks 45 are arranged in a stagger manner to increase the heat dissipating area. Alternatively, the additional heat sinks 45 respectively have a central hollow portion 46 to expose a central portion 30c of the top heat sink 30 corresponding to underlying thermal paste 15 or the chip 12. Thereby, heat dissipation from the chip 12 to the outside can be accelerated.

Seventh Preferred Embodiment

Figure 9:
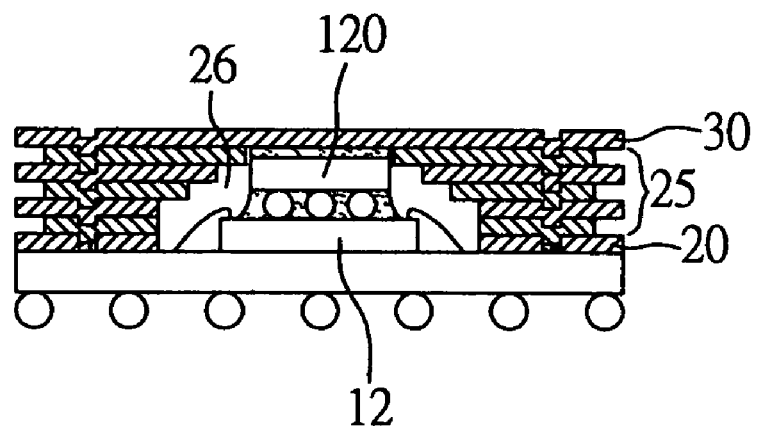
FIG. 9 is a cross-sectional view of the semiconductor package according to a seventh preferred embodiment of the invention.

The heat dissipating structure is particularly advantageous when applied in a chip stack package. FIG. 9 is a cross-sectional view of a heat dissipating structure according to a seventh embodiment of the invention. Since the heat dissipating structure has no limitation of aspect ratio, the thickness of the top heat sink 30 is not necessarily increased as the number of the chip stacked increases. The hollow portions of the interlayer heat sinks 25 may be varied to match the size of the chip stack. The chip accommodating space is changed as illustrated in FIG. 9 to shorten the heat dissipating path from an uppermost chip 120.

Eighth Preferred Embodiment

Figure 10:
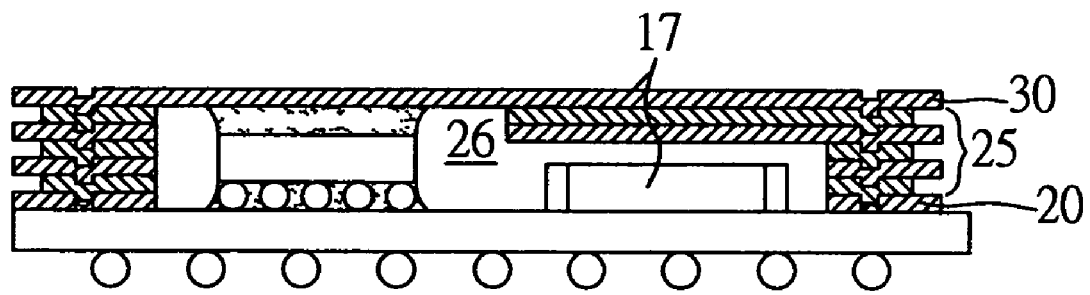
FIG. 10 is a cross-sectional view of the semiconductor package according to an eighth preferred embodiment of the invention.

Furthermore, when other passive components, in addition to the chips, are mounted on the substrate, the heat dissipating structure of the invention still is suitable for a semiconductor package with a low material cost and optimal heat dissipation. FIG. 10 is a cross-sectional view of a heat dissipating structure according to an eight embodiment of the invention. The size of the hollow portion 26 of the interlayer heat sink 25 is changed such that the side area of the heat dissipating structure is not increased due to the presence of the passive component 17. Meanwhile, the heat dissipating path from the passive component 17 is significantly shortened to overcome the problem of the conventional heat sink.

Ninth Preferred Embodiment

Figure 11A:
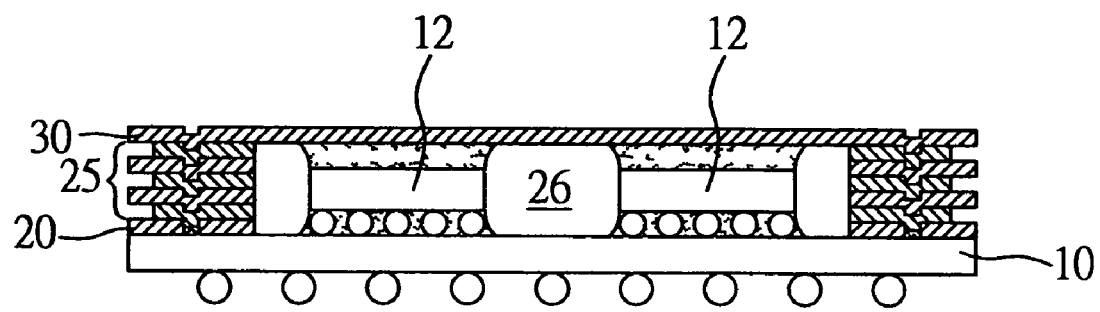
FIG. 11A is a cross-sectional view of the semiconductor package according to a ninth preferred embodiment of the invention.
Figure 11B:
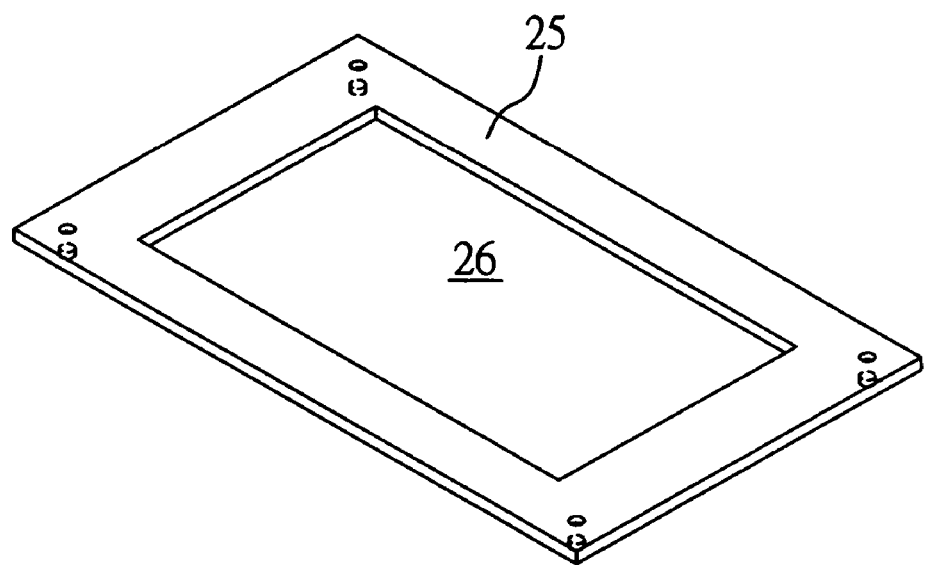
FIG. 11B is a schematic view of an interlayer heat sink used in the semiconductor package of FIG. 11A.
Figure 12A:
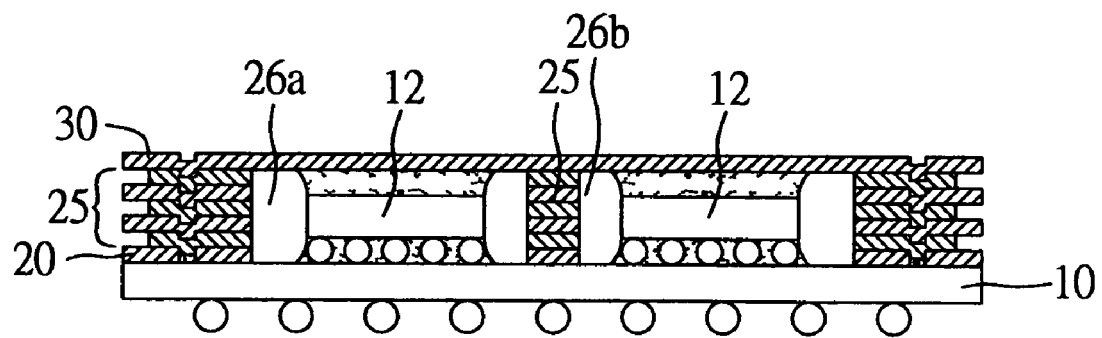
FIG. 12A is a cross-sectional view of another example of the semiconductor package according to the ninth preferred embodiment of the invention.
Figure 12B:
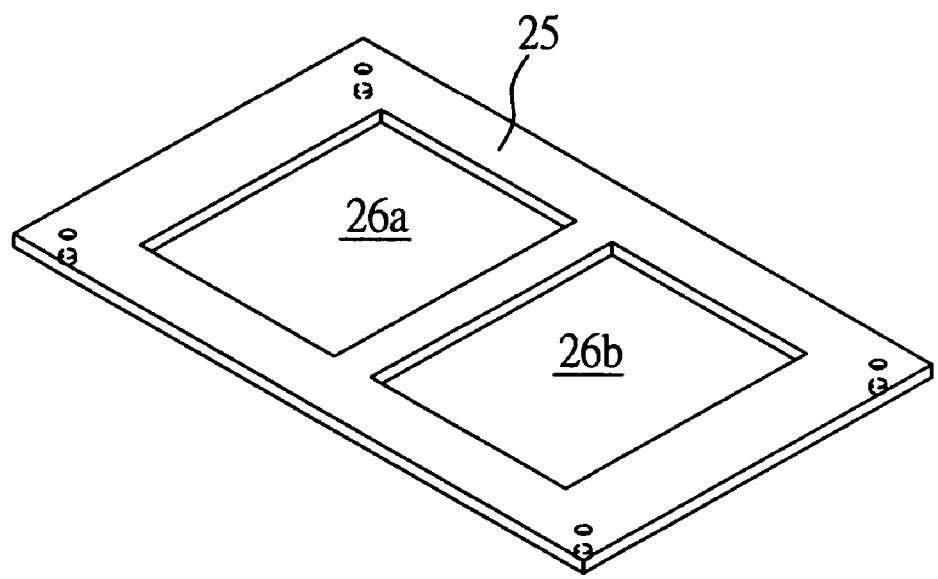
FIG. 12B is a schematic view of an interlayer heat sink used in the semiconductor package of FIG. 12A.

The heat dissipating structure of the invention is suitable for a multiple-chip package to mount the chips in the chip accommodating space, being defined by the hollow portions as shown in FIG. 11A. In other words, the hollow portions 26 of the interlayer heat sinks 25 and the bottom heat sink 20 respectively accommodate the chips 12, and provide more heat dissipating paths from the chip 12.

Tenth Preferred Embodiment

Figure 13:
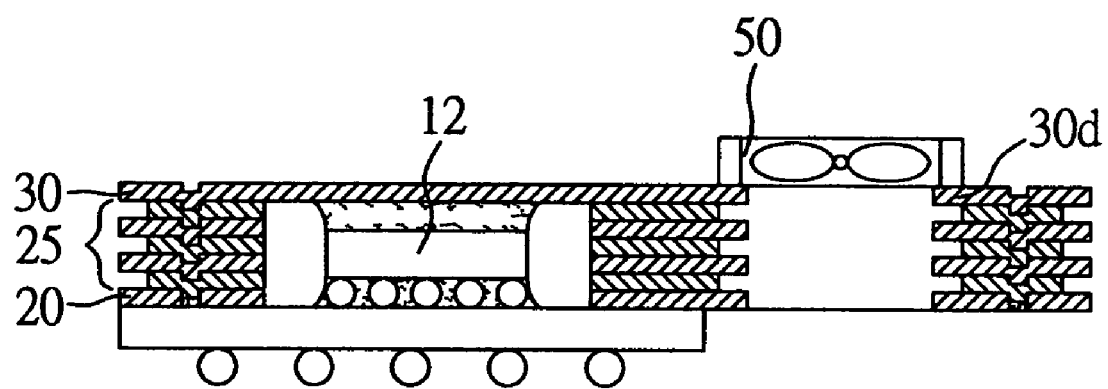
FIG. 13 is a cross-sectional view of the semiconductor package according to a tenth preferred embodiment of the invention.

FIG. 13 is a cross-sectional view of a heat dissipating structure according to a tenth embodiment of the invention. The lengths of the bottom heat sink 20, the interlayer heat sinks 25 and the bottom heat sink 30 are increased. On an extended region 30d of the top heat sink 30 is added a forced fan 50 to ventilate the heat from the chip 12. Furthermore, an airflow path formed by the interlayer heat sink contributes to speed up heat dissipation.

Eleventh Preferred Embodiment

Figure 14A:
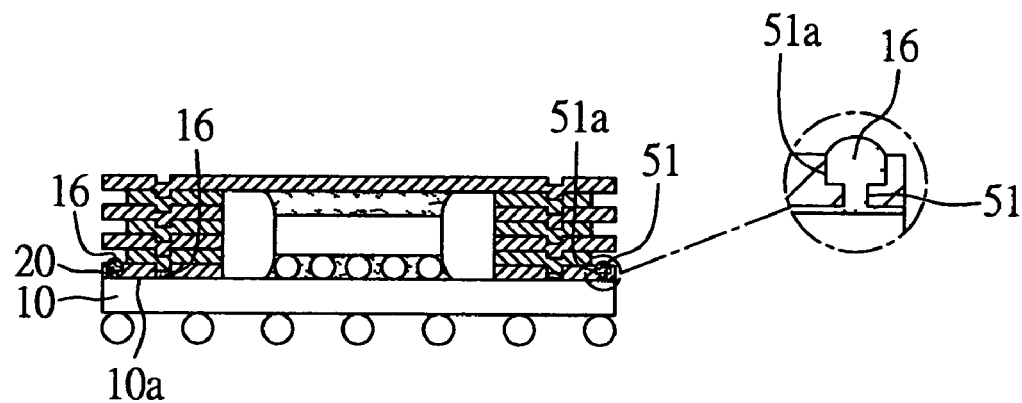
FIG. 14A and FIG. 14B are cross-sectional views of the semiconductor package according to an eleventh preferred embodiment of the invention.
Figure 14B:
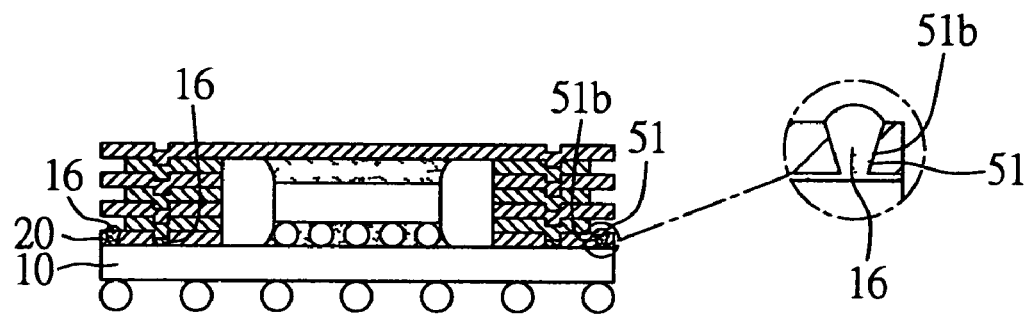

The forging process of the prior art is not used to produce the heat dissipating structure of the invention. Therefore, a positioning mechanism may be further formed on the bottom heat sink 30 to overcome delamination of the heat sink due to vibration. A slot 51 is formed by punching for the adhesive 16 applied over the first surface 10a by pressure to flow. As shown in FIG. 14A, the slot 51 has a stepped inner surface 51a to increase the contact area of the adhesive 16 with the bottom heat sink 20, thereby increasing the adhesion of the heat sink 20. As shown in FIG. 14B, the slot 51 alternatively has a tilted inner surface 51b to increase the adhesion of the heat sink 20.

Figure 15:
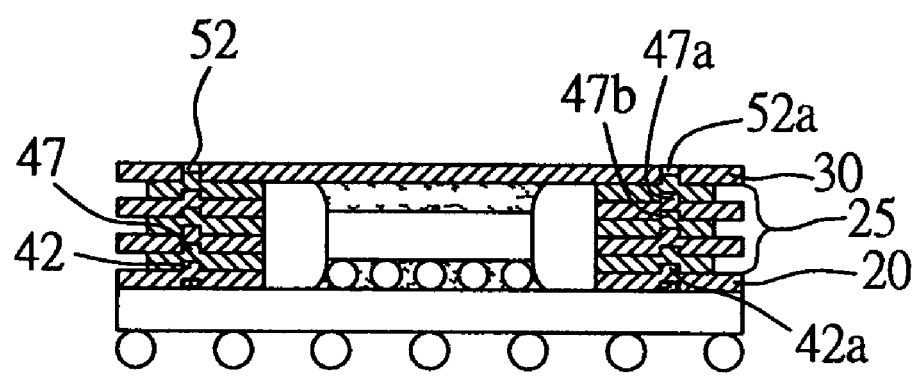
FIG. 15 is a cross-sectional view of another example of the positioning portions on heat sinks according to the invention.

The stack of the positioning portions of the plate-shaped heat sinks in different ways allows the semiconductor package to meet various requirements. For example, the punching direction of the positioning portion in this embodiment shown in FIG. 15 is reverse to those in the above embodiments. As shown in FIG. 15, the positioning portion 52 near the corner of the top heat sink 30 is a hole 52a. Each positioning portion 47 of one interlayer heat sink 25 includes a flange 47a and a recess 47b. Each third positioning portion 42 formed on the interlayer heat sink 20 is a flange 42a to fit another recess for positioning and stacking the heat sinks. Formation of various positioning mechanisms on the heat sink is not limited to the ways described in the above embodiments, as long as the positioning portions are not formed by forging.

Figure 16A:
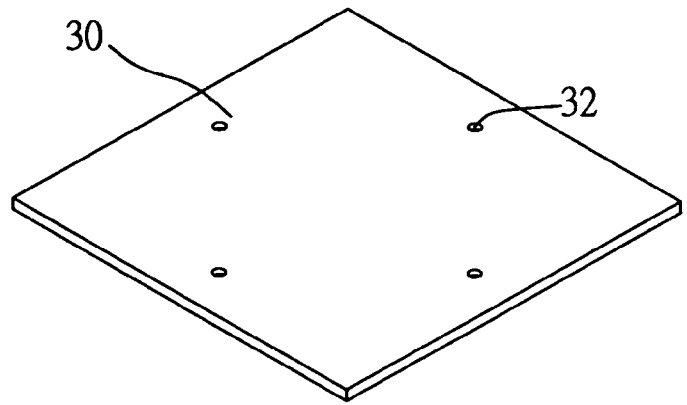
FIG. 16A to FIG. 16C are schematic views showing the location of the positioning portions on heat sinks of FIG. 15.
Figure 16B:
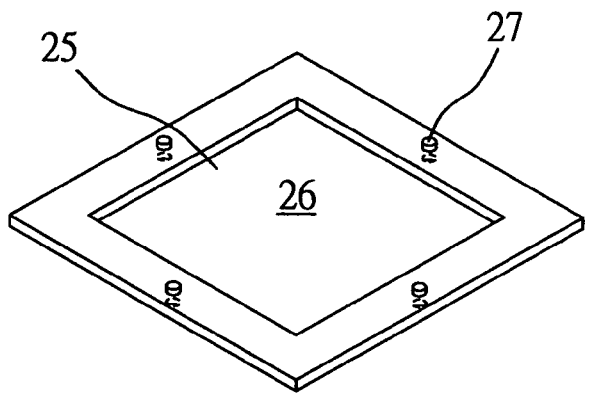
Figure 16C:
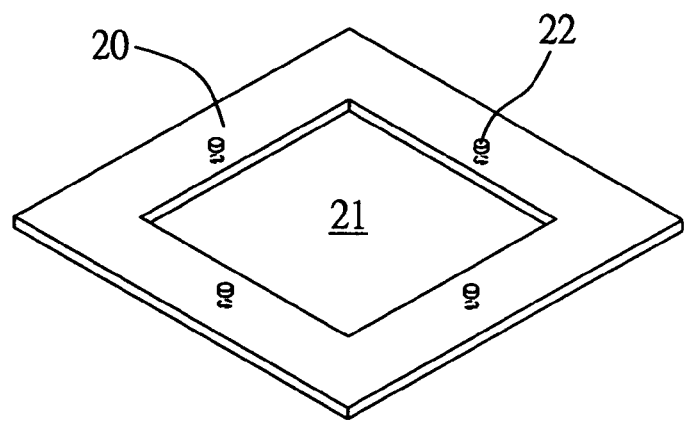
Figure 17:
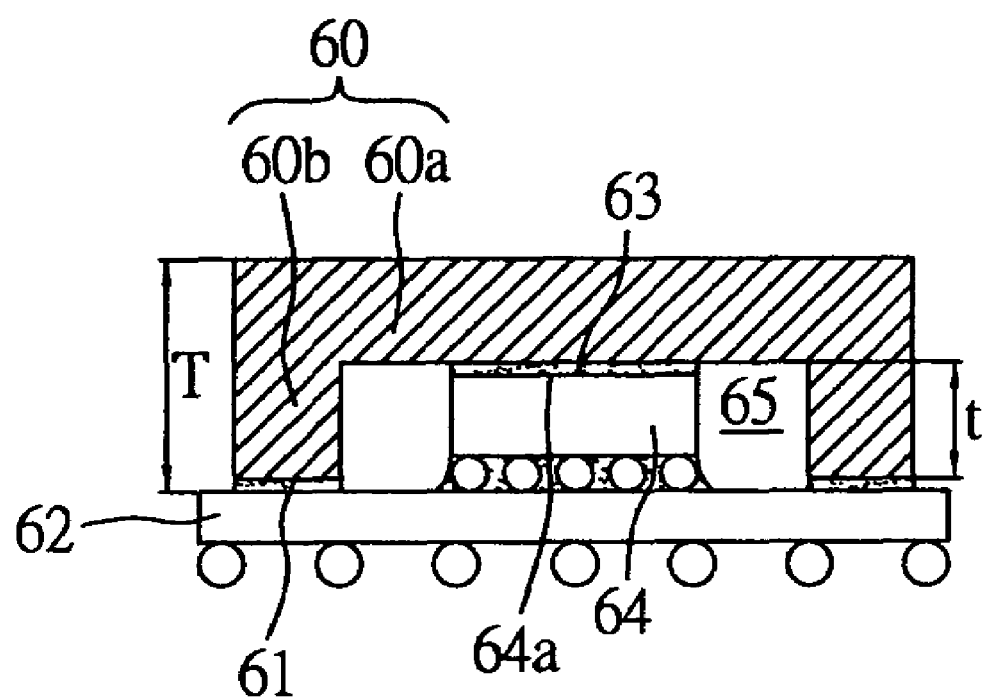
FIG. 17 (PRIOR ART) is a cross-sectional view of a conventional flip-chip semiconductor package having a heat sink.
Figure 18A:
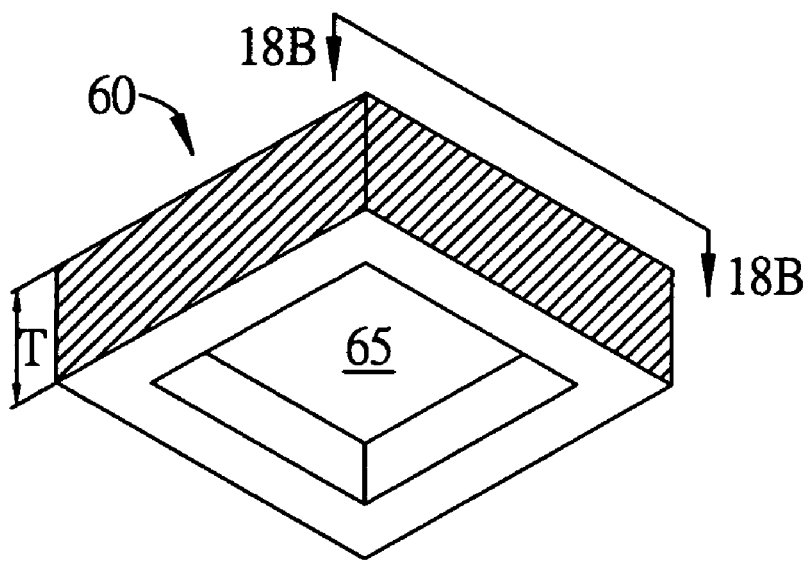
FIG. 18A (PRIOR ART) is a schematic view of a square heat sink used in the semiconductor package of FIG. 17.
Figure 18B:
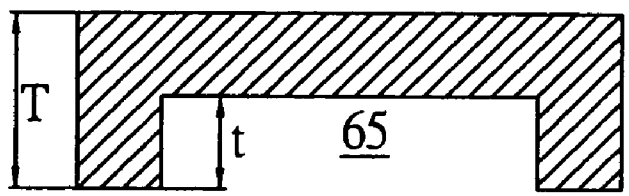
FIG. 18B (PRIOR ART) is a cross-sectional view of the heat sink of FIG. 18A.
Figure 19:
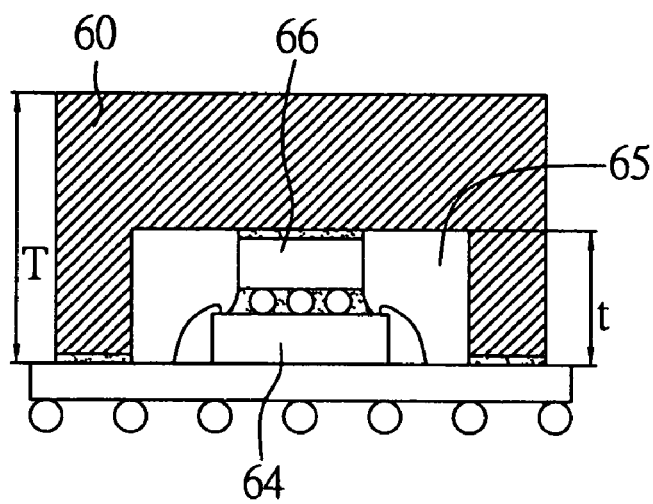
FIG. 19 (PRIOR ART) is a cross-sectional view of a conventional flip-chip semiconductor package having dual stacked chips.
Figure 20:
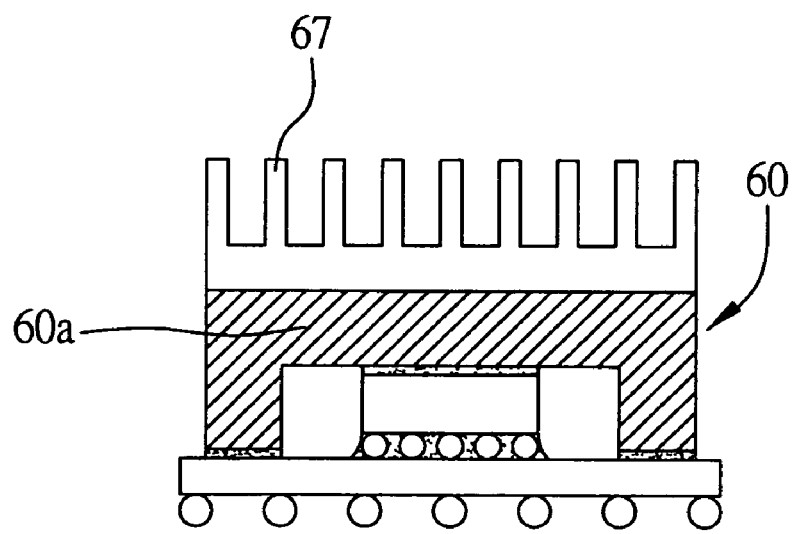
FIG. 20 (PRIOR ART) is a cross-sectional view of a conventional flip-chip semiconductor package having heat dissipating fins.
Figure 21:
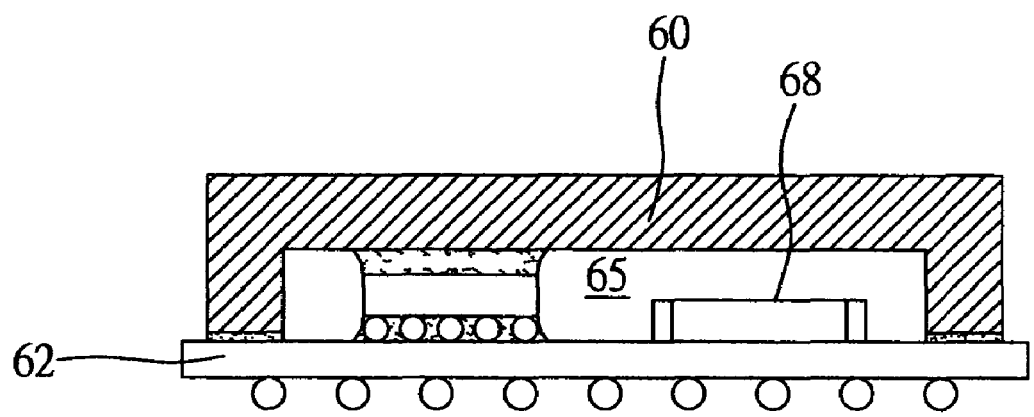
FIG. 21 (PRIOR ART) is a cross-sectional view of a conventional flip-chip semiconductor package having a passive component.
Figure 22:
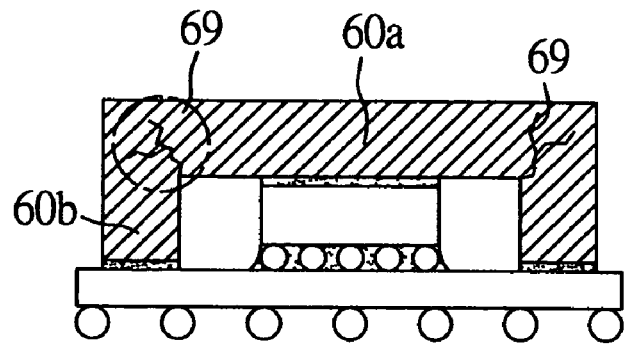
FIG. 22 (PRIOR ART) is a schematic view showing a conventional flip-chip semiconductor package having a cracked heat sink.
Figure 23:
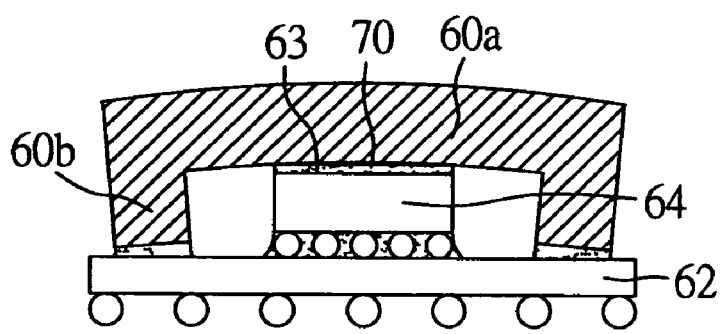
FIG. 23 (PRIOR ART) is a schematic view of a conventional flip-chip semiconductor package having a heat sink delaminated from a substrate.

Furthermore, the positioning portions formed by the above embodiments are formed near one corner of the respective heat sink. The configuration of the positioning portion is not only for matching the hollow portions 26, 21 of the bottom heat sink 20 and the interlayer heat sinks 25, but also provides better positioning force for the heat sinks 20, 25, 30. The location of the heat sinks is not limited to those illustrated above. FIG. 16A, FIG. 16B and FIG. 16C illustrate various locations of the positioning portions 22, 27, 32 of the heat sinks 20, 25, 30. The positioning portions 22, 27, 32 located in different ways from the above positioning portions have similar functions to the positioning portions 20, 25, 30.

As described above, the semiconductor package with a heat dissipating structure according to the invention is not formed by a conventional forging process. The production cost of the semiconductor package is lowered. The semiconductor package has no limitation of aspect ratio to meet the requirement of thin type package. Meanwhile, the heat dissipating structure optionally may have various shapes of heat sinks or enlarged heat dissipating areas so as to prevent deformation or delamination while increasing the adhesion of the heat sinks. Thereby, prior art technical bottlenecks are overcome.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package having a heat dissipating structure, comprising:
    a substrate having a first surface and a second surface opposite to the first surface;
    at least one chip mounted on the first surface of the substrate and electrically connected to the substrate;
    a heat dissipating structure comprising a first heat sink and a plurality of second heat sinks, wherein the first heat sink has at least one first positioning portion, and each of the second heat sinks has at least one second positioning portion and at least one hollow portion, and wherein the second heat sinks are mounted on the first surface of the substrate and stacked on one another by the second positioning portions thereof, and the first positioning portion of the first heat sink is mounted on the second positioning portion of the uppermost one of the second heat sinks, allowing the chip to be accommodated in a space defined by the first heat sink, the hollow portions of the second heat sinks and the substrate; and
    a plurality of solder balls mounted on the second surface of the substrate.

2. The semiconductor package of claim 1, wherein the first and second heat sinks are each shaped as a plate.

3. The semiconductor package of claim 1, wherein the first positioning portion is a flange, and the second positioning portion includes a flange and a recess.

4. The semiconductor package of claim 1, wherein first positioning portion is a recess, and the second positioning portion includes a flange and a recess.

5. The semiconductor package of claim 1, wherein the first and second positioning portions are respectively formed at peripheral regions of the first and second heat sinks.

6. The semiconductor package of claim 1, wherein peripheries of the first heat sink and the second heat sinks are aligned with each other.

7. The semiconductor package of claim 1, wherein peripheries of the first heat sink and the second heat sinks are arranged in a stagger manner.

8. The semiconductor package of claim 1, wherein the second heat sinks are stacked on the substrate in a manner that peripheries of the second heat sinks are aligned with one another.

9. The semiconductor package of claim 1, wherein the second heat sinks are stacked on the substrate such that peripheries of the second heat sinks are arranged in a stagger manner.

10. The semiconductor package of claim 1, wherein the first heat sink has a surface area larger than that of each of the second heat sinks.

11. The semiconductor package of claim 1, wherein at least one additional heat sink is stacked on a side of the first heat sink free of contact with the uppermost one of the second heat sinks.

12. The semiconductor package of claim 11, wherein the additional heat sink has at least one hollow portion corresponding in position to the chip.

13. The semiconductor package of claim 1, wherein the heat dissipating structure further comprises a fan mounted on the first heat sink.

14. The semiconductor package of claim 1, wherein a plurality of slots are formed on a side of the second heat sink in contact with the substrate.

15. The semiconductor package of claim 14, wherein each of the slots has a stepped inner surface.

16. The semiconductor package of claim 14, wherein each of the slots has a tilted inner surface.

17. The semiconductor package of claim 1, wherein the chip is electrically connected to the first surface of the substrate via a plurality of solder bumps.

18. The semiconductor package of claim 17, further comprising an insulation material applied around the solder bumps.

19. The semiconductor package of claim 1, further comprising a thermal paste for adhering the first heat sink and the chip.

20. The semiconductor package of claim 1, further comprising an adhesion material filled between the second heat sinks and the first surface of the substrate.

* * * * *